(12) United States Patent
Talanov et al.

(10) Patent No.: US 6,943,562 B2
(45) Date of Patent: Sep. 13, 2005

(54) METHOD AND SYSTEM FOR NON-CONTACT MEASUREMENT OF MICROWAVE CAPACITANCE OF MINIATURE STRUCTURES OF INTEGRATED CIRCUITS

(75) Inventors: Vladimir V. Talanov, Greenbelt, MD (US); Andrew R. Schwartz, Bethesda, MD (US)

(73) Assignee: Neocera, Inc., Beltsville, MD (US)

( * ) Notice: Subject to any disclaimer, the term of this patent is extended or adjusted under 35 U.S.C. 154(b) by 76 days.

(21) Appl. No.: 10/717,448

(22) Filed: Nov. 21, 2003

(65) Prior Publication Data

US 2004/0100279 A1 May 27, 2004

Related U.S. Application Data

(60) Provisional application No. 60/428,245, filed on Nov. 22, 2002.

(51) Int. Cl.[7] .............................................. G01R 27/28
(52) U.S. Cl. ...................................... 324/633; 324/637
(58) Field of Search ................................. 324/633, 637, 324/750, 754, 765

(56) References Cited

U.S. PATENT DOCUMENTS

| | | |
|---|---|---|
| 6,034,535 A | 3/2000 | Liberman et al. |
| 6,097,205 A | 8/2000 | Liberman et al. |
| 6,163,163 A | 12/2000 | Kohn et al. |
| 6,516,281 B1 * | 2/2003 | Wellstood et al. .......... 702/130 |

\* cited by examiner

*Primary Examiner*—Vincent Q. Nguyen
*Assistant Examiner*—Walter Benson
(74) *Attorney, Agent, or Firm*—Rosenberg, Klein & Lee

(57) ABSTRACT

In the method and system for non-contact measurements of microwave capacitance of test structures patterned on wafers used for production of modern integrated circuits, a near-field balanced two-conductor probe is brought into close proximity to a test structure, and the resonant frequency of the probe for the test structure is measured. The probe is then positioned at the same distance from the uniform metallic pad, and the resonance frequency of the probe for the uniform metallic pad is measured. A shear force distance control mechanism maintains the distance between the tip of the probe and the metallic pad equal to the distance between the tip of the probe and the test structure. The microwave capacitance of the test structure is then calculated in accordance with a predefined formula. The obtained microwave capacitance may be further used for determining possible defects of the test structure.

20 Claims, 3 Drawing Sheets

METHOD AND SYSTEM FOR NON-CONTACT MEASUREMENT OF MICROWAVE CAPACITANCE OF MINIATURE STRUCTURES OF INTEGRATED CIRCUITS

REFERENCE TO RELATED APPLICATIONS

This Utility Patent Application is based on a Provisional Patent Application Ser. No. 60/428,245 filed 22 Nov. 2002.

FIELD OF THE INVENTION

The present invention relates to measurement techniques. In particular, this invention directs itself to a technique for non-contact measurement of microwave capacitance of miniature structures of integrated circuits using near field microwave probes. The concept is based on microwave measurements employing a balanced two-conductor transmission line resonator to obtain a microwave capacitance of miniature structures in order to monitor integrated circuits fabrication process.

More in particular, the present invention is directed to a method and system for non-contact measurement of microwave capacitance of test structures which do not require knowledge of probe geometry or the absolute distance from the tip of the probe to the test structure, and in which the microwave capacitance of the test structure is calculated based on measured resonant frequencies of the near field microwave probe for the miniature structure under test and the uniform metallic pad. The distance between the near field microwave probe and the uniform metallic pad is maintained equal to the distance between the near field microwave probe and the test structure by a distance control mechanism during the testing.

BACKGROUND OF THE INVENTION

A fundamental shift is taking place in the fabrication of integrated circuits, and in particular in the construction of the multiple wiring layers that provide connections to the tens of millions of transistors on a state-of-the-art chip. For decades, the standard in the industry has been the use of aluminum wires isolated from each other by silicon dioxide. Despite the success of this combination, it is now placing limitations on the performance of the chips. In order to obviate these limitations, the semiconductor industry has begun to search for replacements for aluminum and/or silicon dioxide that can provide enhanced device performance.

Two shifts in fabrication of integrated circuits are currently taking place: (1) from aluminum to copper wires to reduce the resistance of the metal wires, and (2) from silicon dioxide to dielectrics with lower dielectric constants k, commonly referred to as 'low-k' materials. The move away from silicon dioxide as the interlayer dielectric has been driven by the need to reduce the delay times along the wires in the complex circuits. This has opened up a wide field of research and development in the semiconductor industry focused on the fabrication and characterization of new high-performance materials.

However, the stable, well-understood nature of silicon dioxide has led to an absence of effective tools and methods for characterizing dielectric materials. As a result, progress toward the identification and optimization of new dielectric materials is slowed by the lack of characterization instruments.

In standard aluminum/silicon dioxide processes, the wiring layers are formed by first laying down a uniform aluminum film, etching away the aluminum in the regions between the wires, and then filling these regions with silicon dioxide. The switch from aluminum to copper has changed this process, since there is no effective way to etch copper. Thus, for copper/dielectric based integrated circuits, the Damascene process is generally used, in which the dielectric material (either silicon dioxide or a low-k dielectric) is initially deposited. The dielectric layer is then etched to form trenches where the wires will be formed and finally the copper is deposited into these trenches.

The Damascene process has been somewhat successful, but has also led to a wide range of problems that were not encountered in the standard $Al/SiO_2$ technology. These problems have been particularly common when the typically less-stable low-k dielectrics are used. For example, the dielectric etching process necessary to form the trenches for copper often damage the dielectric material causing a change in its dielectric constant, and as a consequence, a change in the performance of the device. This type of damage often occurs at the interface between the metal and dielectric and causes changes in the capacitance between wires, thus affecting device performance.

Measuring capacitance is an important step in monitoring the fabrication process of integrated circuits. The standard method for doing this is to build large capacitance test structures directly into the device itself and then measure the capacitance of these structures by making direct contact to them either through pins on the finished device or by placing small probes on contact pads. This type of measurement is typically limited to relatively low frequencies (below 1 MHz) and requires large test structures in order to have a large enough capacitance (>1 pico Farad) to overcome the stray capacitances in the system.

It therefore would be highly desirable to have a non-contact technique for capacitance measurement of miniature structures performed at microwave (and higher) frequencies.

SUMMARY OF THE INVENTION

It is an object of the present invention to provide a technique for non-contact measurement of microwave capacitance of miniature structures of integrated circuits performed at microwave (and higher) frequencies.

It is another object of the present invention to perform non-contact measurements of the microwave capacitance of test structures with the use of a near field balanced two-conductor microwave probe. The measurement is made at any point in the fabrication process without making contact with the test structures which may be very small (a few microns or less), and where the measurement is sensitive to extremely small changes in capacitance (on the order of 0.1 aF).

It is a further object of the present invention to provide a method and apparatus for measurement of microwave capacitance of miniature structures with near field microwave probes which employ an independent distance control mechanism for maintaining the tip of the probe at an unknown distance from the miniature test structure but nominally equal to the distance of the tip from the uniform metallic pad.

In accordance with the principles herein described, the present invention defines a method for non-contact measurement of microwave capacitance of a miniature structure of integrated circuits, which includes the steps of:

positioning a near field microwave probe at a predetermined distance from a miniature structure under the test, measuring a resonant frequency $f_s$ of said near-field microwave probe for said miniature structure under the test, positioning said near-field microwave probe at said predetermined distance from a uniform metallic structure, measuring a resonant frequency $f_c$ of said near-field microwave probe for said uniform metallic structure, and calculating the microwave capacitance $C_s$ of said miniature structure under the test as $$C_s = \frac{(f_e - f_c)(f_e - f_c)}{(f_s - f_c)4f_e^2 Z_0} \quad (1)$$

wherein $f_e$ is the resonant frequency of said near-field microwave probe in air, and $Z_0$ is the characteristic impedance of said near-field microwave probe.

The near-field microwave probe is directed to a balanced two-conductor transmission line resonator which includes a pair of conductors extending in spaced relationship therebetween and separated by a dielectric media.

The distance between the near-field microwave probe and the uniform metallic structure is maintained equal to the predetermined (but unknown) separation between the near-field microwave probe and the miniature structure under the test by a closed-loop distance control mechanism, which may include a shear force-based or atomic force distance control mechanism. The distance maintained is below 50–100 nm.

An area of the uniform metallic structure (contact pad) is preferably at least as large as the size of a cross-section of near-field microwave probe's tip.

The resonant frequencies $f_s$ and $f_c$ are first obtained by measuring the absolute value of the first derivative of a power reflected from or transmitted through the near-field microwave probe as a function of a frequency of a signal applied thereto. Secondly, the resonant frequencies $f_s$ and $f_c$ are determined by one of the numerical techniques, such as:

(a) determining the resonant frequency $f_s$ and $f_c$ as the frequency at the point on said measured curve where said measured curve has a minimum;

(b) determining the resonant frequency $f_s$ and $f_c$ as the frequency at the point of said measured curve where the first derivative of the measured power with respect to frequency equals zero and second derivative of the measured power is positive; and/or (c) fitting the obtained measured curve to an even order polynomial, and finding the frequency where the first derivative of said polynomial equals to zero.

The miniature structures may include an inter-digital comb-like capacitor, and/or a single metal wire (or a trench)/dielectric, and/or an array of metal/dielectric trenches, and/or an array of interconnect lines, and/or a multi-layered structure.

The calculated microwave capacitance $C_s$ may be further used in fabrication quality control by comparing the $C_s$ with a predetermined capacitance value and judging whether the miniature structure is defective based on a deviation of the $C_s$ from the predetermined capacitance value.

The present invention is also a system for non-contact measurement of microwave capacitance of miniature structures of integrated circuits, which includes a miniature structure being tested, a near-field microwave probe having a tip, a uniform metallic pad of the size at least equal or larger to the cross-section of the tip of the near-field microwave probe, a shear force-based (or atomic force based) distance control unit operatively coupled to the near-field microwave probe to control tip-to-miniature structure and tip-to-uniform metallic pad separation, an acquisition mechanism for acquiring resonant frequency $f_s$ of the near-field microwave probe for the miniature structure under test and the resonant frequency $f_c$ of the near-field microwave probe for the uniform metallic pad, and a processing mechanism for calculating the microwave capacitance $C_s$ of the miniature structure under test as $$C_s = \frac{(f_e - f_c)(f_e - f_c)}{(f_s - f_c)4f_e^2 Z_0} \quad (2)$$

where $f_e$ is the resonant frequency of the near-field microwave probe in air, and $Z_0$ is the characteristic impedance of the near-field microwave probe.

In this system, the near-field microwave probe includes a balanced two-conductor transmission line resonator having a pair of conductors extending in spaced relationship therebetween and separated by a dielectric media.

The system may further include a mechanism for analysis of the calculated microwave capacitance $C_s$ of the miniature structure under test for judging whether the miniature structure is defective or not for fabrication quality control purposes.

These and other novel features and advantages of this invention will be fully understood from the following detailed description of the accompanying Drawings.

DESCRIPTION OF THE PREFERRED EMBODIMENT

Figure 1:
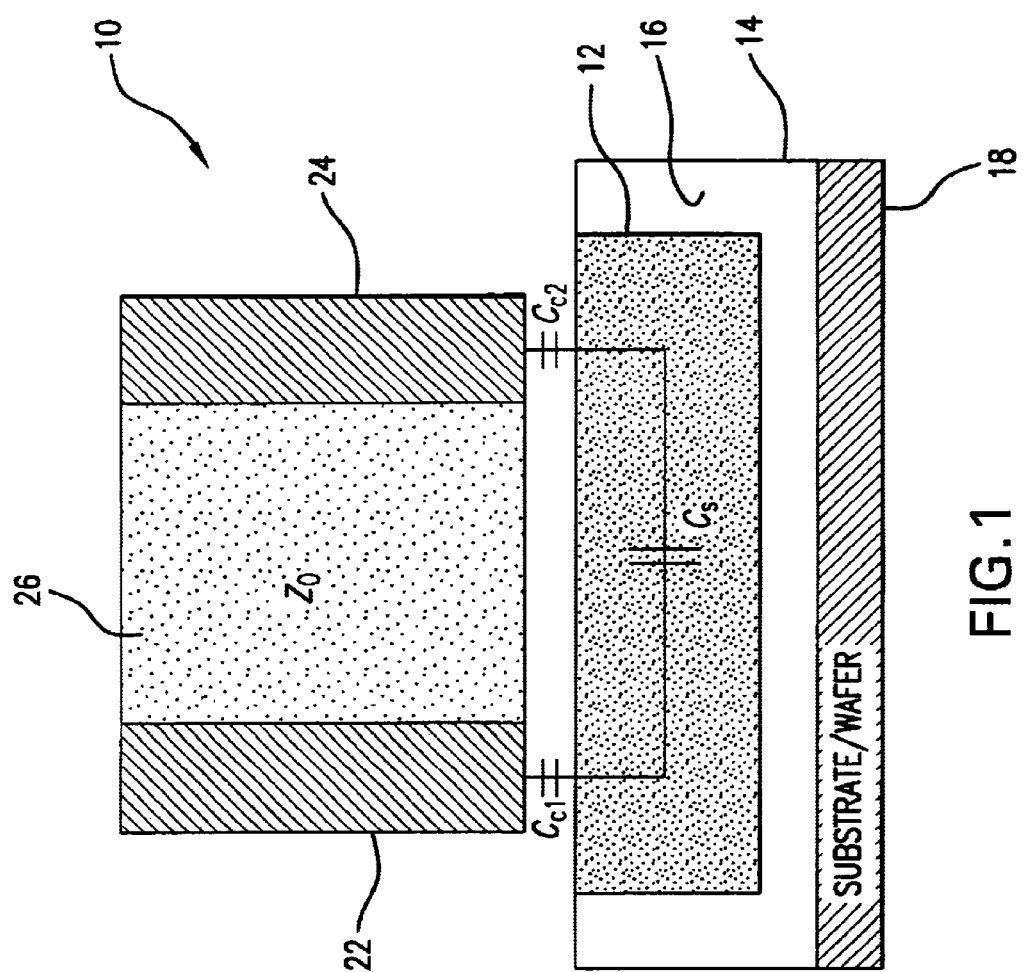
FIG. 1 is a schematic representation of a balanced two-conductor near-field probe capacitively coupled to an arbitrary test structure with capacitance $C_s$ to be measured.

Referring to FIG. 1, a near-field balanced two-conductor probe 10 is used for quantitative non-contact measurement of the microwave capacitance of capacitor test structure 12 patterned on a wafer 14 used for production of modern integrated circuits. The capacitor test structure on the wafer can be an inter-digital comb-like capacitor, or an array of metal/dielectric trenches, and/or coupled interconnect lines which form multi-layered structures having a single or multiplicity of trenches/wires embedded in and separated by dielectric 16 of the wafer 14. Wafer 14 may have a ground layer 18.

Figure 2:
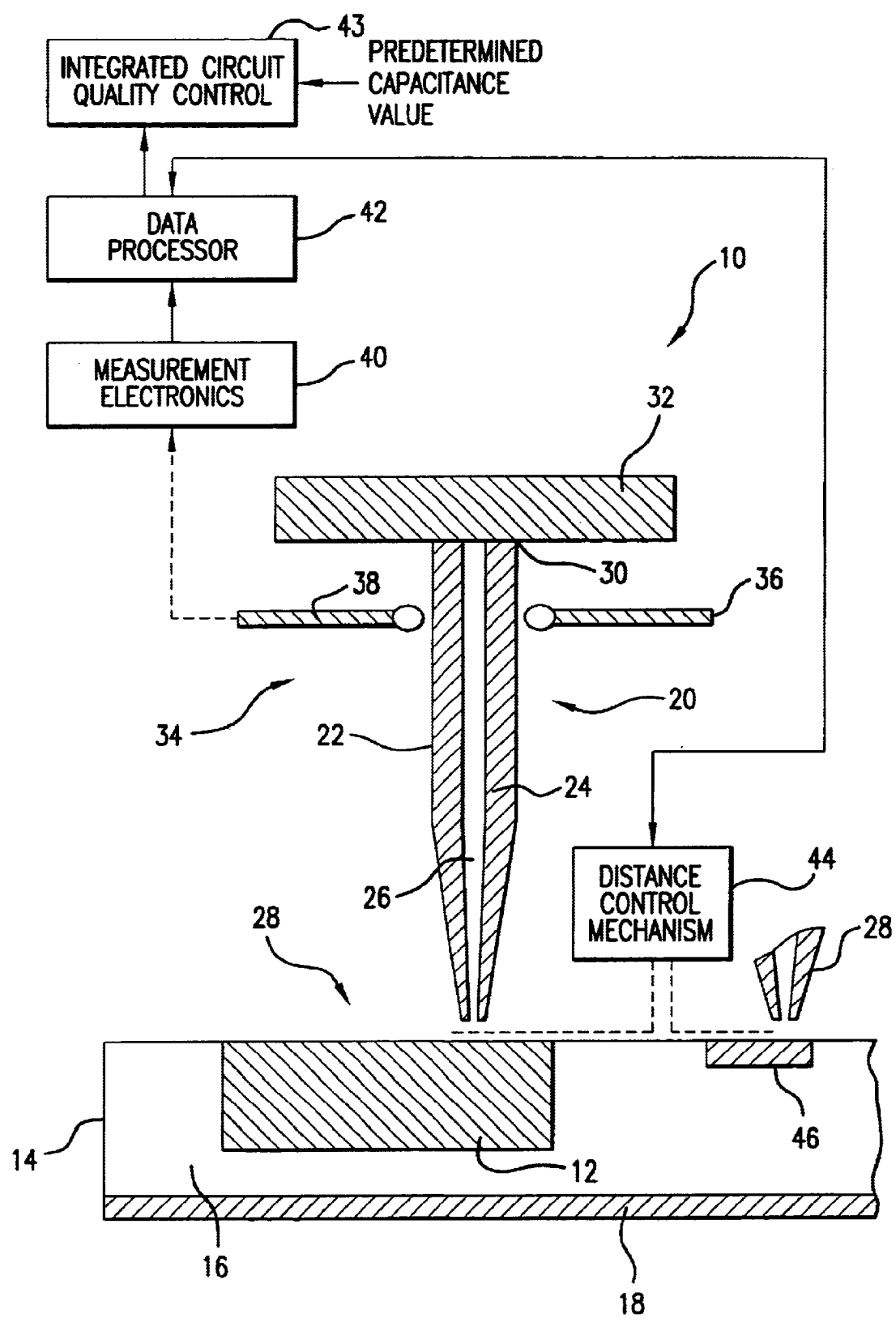
FIG. 2 schematically depicts a system of the present invention forming a two-conductor transmission line resonator with a probe end used for measurement of capacitance of a miniature structure.

The probe 10, in accordance with the method of the present invention, is brought into close proximity to the test structure 12 and fixedly positioned by means of a closed loop distance control mechanism such as shear-force or atomic force based distance control mechanism as will be further disclosed in detail with regard to FIG. 2.

The near-field probe 10, shown in FIGS. 1–4, used in the method and system of the present invention for non-destructive determination of the microwave capacitance of the test structure 12 is based on a balanced two-conductor transmission line 20. As shown in FIG. 2, the balanced two-conductor transmission line 20 includes two spatially separated and symmetrically arranged electrical conductors 22 and 24. The conductors 22 and 24 may have a cylindrical, semi-cylindrical, rectangular, or similar type cross-section contour. Further, the conductors 22 and 24 may be formed out of copper, tungsten, gold, silver, or aluminum strips deposited onto a probe dielectric 26, for example, a tapered glass fiber. A probing end (tip) 28 of the transmission line 20 is brought in close proximity to the test structure 12 and an opposing end 30 of the transmission line 20 is either connected to electronics, or to a terminating plate 32 to form a resonator structure 34 for purposes to be described in following paragraphs.

The probe 10 may operate as a transmission line for feeding a signal to the sample 12 and measuring the reflected signal to obtain a more sensitive and accurate result while employing less expensive equipment. However, the probe 10 of the present invention is envisioned as a resonator structure 34 which is formed by a portion of the transmission line 20 with the conductors 22 and 24 separated by the dielectric medium 26. The dielectric medium is any low-loss dielectric which may include air, a circulating fluid for temperature stabilization, quartz, or high dielectric constant materials for size reduction. As described in previous paragraphs, the probing end 28 of the resonator structure 34 is brought into proximity to the test structure 12 with the opposite end 30 of the transmission line resonator structure 34 coupled to the terminating plate 32. The resonator structure 34 is formed in order to measure the resonant frequency of the resonator structure 34 for determination of the microwave capacitance of the test structure 12 as will be described in detail infra.

The spacing between the two conductors 22 and 24 and their cross-section must be properly chosen for accurate measurement. For instance, the spacing between the conductors 22 and 24 may be on the order of or greater than 1 mm at the top of the resonator and tapered down to a size on the order of the test structure (as small at 50 nm).

The coupling to the resonator 34 is provided by a coupling loop 36 positioned close to the resonator 34. The coupling loop 36 is internal to an optional conducting sheath (not shown). An optional second coupling loop 38 may be used for measurement electronics 40 schematically shown in FIG. 2. All calculations are carried out by data processor 42 based on predetermined formulas applied to the measured data. The processor 42 additionally controls the overall performance and operation of the measurement electronics 40 and a distance control mechanism 44.

The resonator structure 34 forms a $(2n+1)\lambda/4$ or $(n+1)\lambda/2$ resonator $(n=0,1,2,\ldots)$, and its length is determined by the frequency of the lowest mode, e.g., about 25 mm for the $\lambda/2$ mode operating at 4 GHz and quartz dielectric.

The resonator structure 34 may be enclosed in a cylindrical sheath formed of a highly conductive material, such as Cu, Au, Ag, Al). The sheath eliminates both radiation from the resonator 34 and the effect of the probe environment on the resonator characteristics. In particular, the changing influence of moving parts in the proximity of resonator 34 is eliminated. Additionally, the sheath has an opening near the test structure area which allows for an efficient coupling of the test structure 12 to the resonator 34.

In the situation where the spacing between the conductors 22 and 24 is small in comparison to the inner diameter of the sheath, the resonator properties are substantially unaffected by the sheath's presence. The upper portion of the sheath makes electrical contact with the terminating plate 32. The bottom portion of the sheath may have a conical shape in order to provide clear physical and visual access to the sampling area.

As discussed in previous paragraphs, the probing end 28 of the resonator structure 34 is brought into close proximity to the test structure 12 for measurement purposes. The geometry of the probing end (tip) 28, as well as separation between the tip 28 and the test structure 12 is vital to the technique of the present invention for quantitative measurements of the capacitance of the test structure. Since the accurate determination of these parameters is difficult and often impractical, especially for the very small tips (of less than or on the order of a few microns in size), the quantitative measurements of the present invention are performed without any knowledge of either the actual tip geometry or the absolute tip to structure separation. The quantitative measurements are made by employing an independent distance control mechanism 44 schematically shown in FIG. 2 and described in detail infra.

As shown in FIGS. 1–4, the electrical conductors 22 and 24 of the probe 10 are brought into close proximity to the test structure 12. However, they are separated by a small unknown distance, for instance, 50–100 nm. They are capacitively coupled to the structure on the wafer 14 via the microwave displacement current without making any physical contact.

In general, the probe tip "fringe" capacitance $C_t$, can be written as follows:

$$\frac{1}{C_t} = \frac{1}{C_{c1}} + \frac{1}{C_{c2}} + \frac{1}{C_s} \qquad (3)$$

where $C_{c1}$ and $C_{c2}$ are the coupling capacitances between the tip conductors 22 and 24 and test structure 12, and $C_s$ is the test structure capacitance to be determined as shown in FIG. 1.

It is desirable to have $C_s \leq \min\{C_{c1} \text{ and } C_{c2}\}$, since in this case the probe response is going to be mostly determined by the test structure capacitance. The typical value for the coupling capacitance, $C_c$, is in the range of femto-Farads, which allows one to measure test structures with smaller capacitances. The typical minimum capacitance of interdigital comb-like capacitance structures is in the range of pico-Farads since measurement of smaller values by conventional means is extremely difficult. The method of the present invention is inherently capable of measuring much smaller capacitance values.

As an example, the probe 10 includes a foreshortened piece of the uniform transmission line 20 with an open end connected to the tip 28 with the "fringe" impedance at the tip 28 given by $Z_t = 1/i\omega C_t$. Since the tip capacitance $C_t \ll \epsilon_0 \lambda_0$, where $\epsilon_0$ is the permittivity of vacuum, and $\lambda_0$ is the operating wavelength, the structure forms nearly a quarter-wavelength $(\lambda/4)$ resonator 34. Using the standard impedance transformation technique, the following resonant condition for the probe 10 is found:

$$C_t = \frac{f_e - f_{res}}{f_e} \frac{1}{4 f_e Z_0} \qquad (4)$$

where $f_e$ is the probe resonant frequency in air, $f_{res}$ is the resonant frequency with arbitrary sample present, and $Z_0$ is the characteristic impedance of the transmission line 20 that forms the resonator 34.

Generally, the tip geometry and the tip-to-sample separation are unknown. Therefore, in order to perform quantitative measurements of the capacitor under test a probe calibration is required. The probe calibration is performed in the method of the present invention as follows:

first, the probe resonant frequency, $f_s$, is measured for the structure 12 under test at some unknown but small tip-to-sample distance, typically 10 to 100 nm, and second, the probe 10 is placed above a uniform metallic area 46 (for example, a contact pad), as best shown in FIG. 2, that is at least as large as the probe tip cross-section. The tip 28 is held at the same distance above this area 46 as it was above the test structure 12 by the distance control mechanism 44 and its resonant frequency, $f_c$, is measured again.

Finally, from Eqs. (1) and (2), the capacitance $C_s$ of the structure under test is found as follows:

$$C_s = \frac{(f_e - f_c)(f_e - f_s)}{(f_s - f_c) 4 f_e^2 Z_0} \qquad (5)$$

where $Z_0$ can be determined from an independent measurement, an analytical calculation, and/or a numerical simulation.

While Eqs. (4) and (5) were derived for the quarter-wavelength resonator used in this example, similar expressions may be obtained for any resonant structure coupled to the probe tip, such as a half-wavelength ($\lambda/2$) strip line, cavity, or a lumped element resonator.

The distance control mechanism 44 of the present invention, as shown in FIG. 2, may be an atomic force based distance control mechanism. However, mechanism 44 is preferably a shear-force based distance control mechanism where the tip 28 of the resonant structure 34 is maintained at an unknown, but nominally the same or equal distance both in the measuring of the resonant frequency $f_s$ of the probe 10 for the test structure 12 and for the measurement of the resonant frequency $f_c$ of the probe 10 for the contact pad 46.

In order to perform the quantitative measurements with the near-field microwave probes shown in FIGS. 1–4, it is important that the separation between the probe tip 28 and the structure under the study 12 be precisely controlled. Without precise control of this distance, changes in the structure capacitance cannot be distinguished from changes in the distance. To control the distance between the tip 28 and the test structure 12, the distance control unit 44 shown in FIG. 2, is incorporated into the measurement scheme of the probe 10. The distance control unit 44 is coupled bi-directionally to the data processor 42 for data exchange and for control over the operation of the distance control mechanism 44.

The shear force based distance control mechanism 44 is a distance control mechanism applicable for use in near-field scanning optical microscopy (NSOM). The basic concept of the shear force distance control mechanism is that a probe, specifically the tip 28 thereof, is flexible and is mounted onto and dithered by a piezoelectric element or a quartz tuning-fork oscillator (TFO) with an amplitude from a few nanometers down to a few angstroms. When the tip of such a probe is brought in close proximity to the sample surface 12, the amplitude of the tip oscillation is damped by interaction between the tip 28 and the sample surface 12. The motion of the tip is detected by an optical beam deflection technique for the piezo element or by a phase-or-amplitude-locked loop for the tuning fork oscillator.

In the measuring technique of the present invention, a housing (not shown) of the microwave probe 10 is attached to the dithering element, piezoelectric, which in turn is supported by a fine piezo stage. Thus, the tip 28 is dithered by the piezoelectric element with an amplitude ranging from a few nanometers down to a few angstroms. The motion of the tip 28 is detected by an optical beam deflection unit which includes a laser generating a laser beam directed via the oscillating tip 28 to a photodetector. As the tip 28 is brought into close proximity to the test structure 12, the amplitude of the tip oscillation is changed, i.e., damped, by interaction between the tip 28 and the test structure 12 which is detected by the photodetector.

Responsive to the change of the amplitude of the tip oscillator, the photodetector generates an output which is a signal indicative of the change in tip-to-sample separation. The signal from the output of the photodetector is supplied to an input of a lock-in amplifier, responsively generating a control signal. The control signal generated at an output is indicative of unwanted changes in the separation between the tip 28 and the test structure 12. This control signal is fed to a proportional integral derivative controller which generates a control signal which is fed to the fine piezo Z stage for changing the position thereof in a required direction. The probe attached to the fine piezo Z stage adjusts its position with respect to the test structure in order to reach a predetermined separation between the tip 28 and the test structure 12.

The piezo detector, the lock-in amplifier, the proportional integral derivative controller, and the fine piezo Z stage, in combination with the laser, form a feedback loop which maintains the amplitude of the oscillation of the tip 28 of the probe fixed at a value less than a predetermined maximum amplitude of oscillations, and thus, permits precise distance control down to 1 nm.

In performing the quantitative measurement of resonant frequencies $f_s$ and $f_c$, as described in previous paragraphs, the following procedures are performed:

(a) adjust the shear force distance control mechanism 44 in a manner that is capable of holding the tip 28 at some fixed distance d above the test structure 12. Generally, the absolute value of this distance d is not known. However, the distance may be estimated by measuring the shear force signal as a function of the tip-to-sample separation by means of the tip 28 approaching the test structure 12 in the open loop circuitry. It is preferred to maintain the separation d on the order of or less than one-tenth of the dimensions of the tip 28;

(b) measure the resonance frequency $f_s$ of the probe 10 for the test structure 12, and submit the measured $f_s$ to the measurement electronics 40;

(c) move the probe 10 towards the contact pad 46 to position the tip 28 the same distance d above the contact pad 46 (the distance between the tip 28 and the contact pad 46 is controlled by the distance control mechanism 44);

(d) measure the resonant frequency $f_c$ of the probe 10 for the contact pad 46, and submit the measured $f_c$ to the measurement electronics 40; and (e) output data corresponding to $f_s$ and $f_c$ to the data processor 42 for further calculating the capacitance $C_s$ of the test structure 12 in accordance with Eq. (5).

The data processor 42 may also perform operations needed in further quality control of the manufactured integrated circuit on the wafer 14. For this purpose, a predetermined capacitance value for the test structure is provided. The calculated capacitance $C_s$ may be compared in a block 43 (Integrated Circuit Quality Control) to such a predetermined capacitance value, to permit deciding whether the test structure is defective based on deviation of the calculated capacitance $C_s$ of the test structure from the predetermined capacitance value.

The potential fault that could be detected using the method of the present invention may include but is not limited to such defects as Cu voids, Cu diffusion into the dielectric, dielectric damage at interfaces, sidewall damages between the metal of the wire (or a trench) and the dielectric surrounding the metal, etc.

Figure 3:
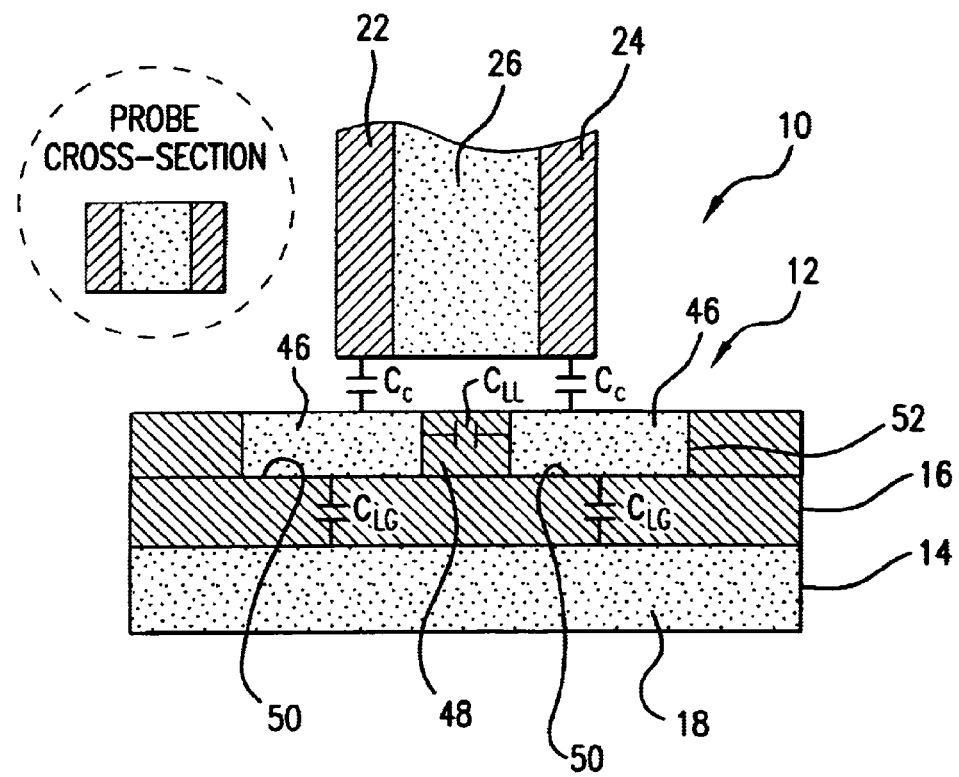
FIG. 3 represents schematically the near-field microwave measurements of the miniature structure having a pair of wires/trenches.

Referring to FIGS. 1, 3, and 4, many types of test structures 12 can be subjected to the non-contact measurement technique of the present invention. For example, as shown in FIG. 3, the test structure 12 includes at least a pair of lines 46 embedded into the dielectric 16 of the wafer 14. In this test structure 12, a capacitive coupling $C_c$ exists between each electrical conductor 22 and 24 and the respective line 46. The line ground capacitance $C_{LG}$ exists between each line 46 and the ground layer 18, and the line-line capacitance $C_{LL}$ is formed between the lines 46. For such a test structure 12, the total capacitance at the probe tip 28 $C_{TOT}$ is described by the equation $$C_{TOT} = \frac{C_c C_{LL}}{2C_{LL} + C_c} + \frac{C_{LG}}{2} \quad (6)$$

In order to be sensitive to variations in $C_{LL}$, the following conditions are to be satisfied:

$$C_{LG}/2 \leq C_{LL} \leq C_c/2 \quad (7)$$

For this test structure 12 which has at least a pair of trenches/wires, in accordance with the measurement described with regard to FIG. 1, first the resonant frequency of the probe 10 with regard to the structure 12 is measured, then the resonant frequency of the probe 10 with regard to a uniform metallic area is measured, and the total capacitance of the structure 12 is calculated in accordance with Eq. (5).

As one of the examples of a geometry of the test structure 12 that would be appropriate for capacitance measurements of the present invention, the distance 48 between the lines 46 would be ~0.25 μm, the width 50 of each line 46 would be ~3 μm, the depth 52 of each line 46 would be ~0.5 μm, and the distance between the bottom of the lines 46 and the ground layer 18 would be ~0.5 μm. For example, the probe 10 would be separated from the structure 12 by the gap of approximately 3 μm, while the width of the electrical conductors 22 and 24 would be approximately 1 μm. With the geometry as described, the following capacitances have been obtained by the method of the present invention: $C_c/2=0.5$ $f_F$, $C_{LL}=0.4$ $f_F$, and $C_{LG}/2=0.3$ $f_F$, which satisfies the condition of Eq. (7). The sensitivity to the changes in capacitance is on the order of $10^{-3}$ $f_F$.

Figures 4A, 4B:
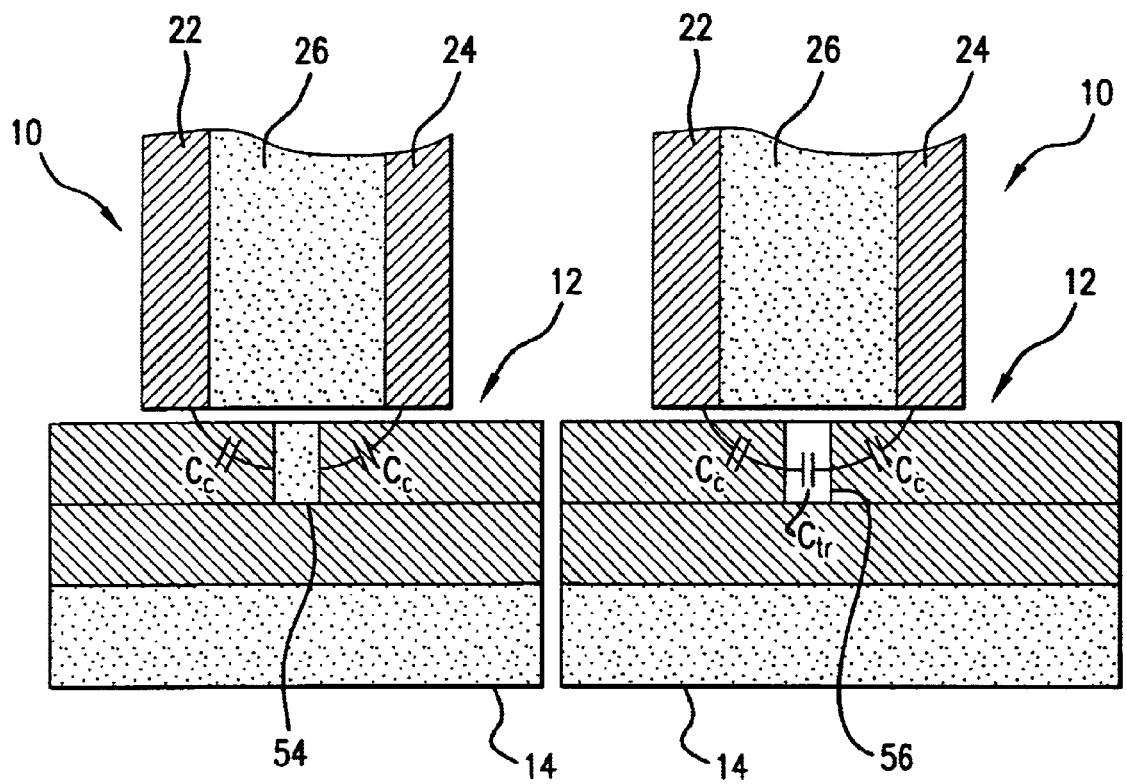
FIGS. 4A and 4B represent schematically a measurement scheme of the present invention for capacitance measurement of a single wire and a single trench respectively.

The method of the present invention is considered also for measuring capacitances of a single wire 54 or a single trench 56 as shown in FIGS. 4A and 4B, respectively.

The method of the present invention may be used for measuring microwave capacitances of different types of test structures such as for instance arrays of trenches, wires, single trench, single wire, inter-digital comb-like capacitor, etc. In these structures, a plurality of types of faults may be detected such as Cu voids, Cu diffusion into dielectric, dielectric damage to interfaces, sidewall damages, etc. by measuring the capacitance of a test structure and comparing such a calculated capacitance to a predetermined capacitance value. By analyzing the deviation of the measured test structure capacitance from such a predetermined capacitance one may determine whether the structure is defective and what kind of defect is encountered with the structure under test.

With the method and system for non-contact measurement of the microwave capacitance of test structures, the unique features advantageously permitted by such a technique of the present invention include the measurement at any point in the manufacturing process without making contact with the test structure. The method and system is applicable to structures that are small (a few microns or less) as compared to the standard test structures which are typically hundreds of microns. The measurement is sensitive to extremely small changes in capacitance, on the order of 0.1 aF, that allows a precise determination of the capacitance of the test structure.

The resonance frequency of $f_s$ and $f_c$ is determined by means of one or some combination of the following numerical techniques which include:

(a) determining the resonant frequency as the frequency at the point of the measured curve wherein on the fitting curve of the measured power vs. frequency, the frequency is at minimum; and/or (b) determining the relative resonant frequency at the frequency at the point of the measured curve where the first derivative of the measured power with respect to frequency equals zero and second derivative of the measured power is positive; and/or (c) fitting the obtained measured curve to an even order (second or higher) polynomial, and finding the frequency where the first derivative of this polynomial equals zero.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is claimed is:

1. A method for non-contact measurement of microwave capacitance of miniature structures of integrated circuits, comprising the steps of:

positioning a near-field microwave probe at a predetermined distance from a miniature structure under the test;

measuring a resonant frequency $f_s$ of said near-field microwave probe for said miniature structure under the test;

positioning said near-field microwave probe said predetermined distance from a uniform metallic structure;

measuring a resonant frequency $f_c$ of said near-field microwave probe for said uniform metallic structure; and, calculating the microwave capacitance $C_s$ of said miniature structure under the test as $$C_s = \frac{(f_e - f_c)(f_e - f_c)}{(f_s - f_c)4f_e^2 Z_0}$$

wherein $f_e$ is the resonant frequency of said near-field microwave probe in air, and $Z_0$ is the characteristic impedance of said near-field microwave probe.

2. The method of claim 1, wherein said near-field microwave probe includes a balanced two-conductor transmission line resonator.

3. The method of claim 1, wherein the measurements are conducted at microwave frequencies.

4. The method of claim 1, wherein said near-field microwave probe includes at least a pair of conductors extending in spaced relationship therebetween and separated by a dielectric medium.

5. The method of claim 1, further comprising the steps of:
maintaining said distance between said near-field microwave probe and said uniform metallic structure equal to said predetermined distance between said near-field microwave probe and said miniature structure under the test by a closed-loop distance control mechanism.

6. The method of claim 5, wherein said closed-loop distance control mechanism includes a shear force-based distance control mechanism.

7. The method of claim 1, wherein said near-field microwave probe includes a tip, wherein an area of said uniform metallic structure is at least the size of a cross-section of said tip of said near-field microwave probe.

8. The method of claim 1, wherein said predetermined distance is maintained below 50–100 nm.

9. The method of claim 1, further comprising the steps of:
measuring the absolute value of the first derivative of a power reflected from or transmitted through said near-field microwave probe as a function of a frequency of a signal applied thereto, and determining said resonant frequencies $f_s$ and $f_c$ by a numerical technique chosen from the group of numerical techniques, consisting of:
(a) determining the resonant frequency $f_s$ and $f_c$ as the frequency at the point on said measured curve where said measured curve has a minimum;
(b) determining the resonant frequency $f_s$ and $f_c$ as the frequency at the point of said measured curve where the first derivative of the measured power with respect to frequency equals zero and second derivative of the measured power is positive; and
(c) fitting the obtained measured curve to an even order polynomial, and finding the frequency where the first derivative of said polynomial equals to zero.

10. The method of claim 1, wherein said uniform metallic structure is a contact pad.

11. The method of claim 1, wherein said miniature structure includes an inter-digital capacitor.

12. The method of claim 1, wherein said miniature structure includes a single metal wire or a trench in a dielectric.

13. The method of claim 1, wherein said miniature structure includes an array of metal/dielectric trenches.

14. The method of claim 1, wherein said miniature structure includes an array of interconnect lines.

15. The method of claim 1, wherein said miniature structure includes a multi-layered structure.

16. The method of claim 1, further comprising the steps of:
comparing said calculated microwave capacitance $C_s$ with a predetermined capacitance value, and judging whether said miniature structure is defective based on a deviation of said $C_s$ from said predetermined capacitance value.

17. A system for non-contact measurement of microwave capacitance of miniature structures of integrated circuits, comprising:
a miniature structure under the test,
a near-field microwave probe having a tip thereof,
a uniform metallic pad of the size approximately equal to the cross-section of said tip of said near-field microwave probe,
a shear force-based distance control unit operatively coupled to said near-field microwave probe to control tip-to-miniature structure separation and tip-to-uniform metallic pad separation,
acquisition means for acquiring resonant frequency $f_s$ of said near-field microwave probe for said miniature structure and resonant frequency $f_c$ of said near-field microwave probe for said uniform metallic pad, and
processing means for calculating the microwave capacitance $C_s$ of said miniature structure under the test as $$C_s = \frac{(f_e - f_c)(f_e - f_c)}{(f_s - f_c)4f_e^2 Z_0}$$

wherein $f_e$ is the resonant frequency of said near-field microwave probe in air, and $Z_0$ is the characteristic impedance of said near-field microwave probe.

18. The system of claim 17, wherein said near-field microwave probe includes a balanced two-conductor transmission line resonator.

19. The system of claim 17, wherein said near-field microwave probe includes at least a pair of conductors extending in spaced relationship therebetween and separated by a dielectric media.

20. The system of claim 17, further comprising means for comparing said calculated microwave capacitance $C_s$ of said miniature structure under the test with a predetermined capacitance value, and for judging whether said miniature structure is defective based on deviation of said $C_s$ from said predetermined capacitance value.

* * * * *